United States Patent [19]
de Givry et al.

[11] Patent Number: 4,959,900
[45] Date of Patent: Oct. 2, 1990

[54] MOUNTING OF ELECTRONIC MICROCOMPONENTS ON A SUPPORT

[75] Inventors: Jacques de Givry, Les Loges En Josas; Jean C. Vallet, Velizy; Jean P. Lalfer, Versailles, all of France

[73] Assignee: MATRA, Paris, France

[21] Appl. No.: 380,433

[22] Filed: Jul. 17, 1989

[30] Foreign Application Priority Data

Jul. 20, 1988 [FR] France ................. 88 09819

[51] Int. Cl.$^5$ ............................................. H05K 3/34
[52] U.S. Cl. ........................................ 29/840; 29/843; 361/388; 361/405; 361/406
[58] Field of Search ............... 29/840, 843; 174/16.3; 361/403, 405, 406, 388; 357/74

[56] References Cited

U.S. PATENT DOCUMENTS

| | | | |
|---|---|---|---|
| 3,700,788 | 10/1972 | Spurck | 357/74 |
| 4,381,602 | 5/1983 | McIver | 29/840 |
| 4,750,089 | 6/1988 | Derryberry et al. | 174/16.3 |
| 4,827,611 | 5/1989 | Pai et al. | 361/405 |

FOREIGN PATENT DOCUMENTS 2523397 3/1982 France .

Primary Examiner—P. W. Echols
Attorney, Agent, or Firm—Larson and Taylor

[57] ABSTRACT

For flat mounting of electronic microcomponents, such as chip carriers, on a printed circuit support, the electrical contacts of the microcomponent are connected to pads on the printed circuit, microcomponents having solderable contacts on a lower face thereof, comprising electrically connecting said solderable contacts of the microcomponent to respective pads on the printed circuit through sections of flexible wires having a sufficient degree of curvature for mechanically uncoupling said microcomponents from said printed circuit support and mechanically connecting the microcomponent to the support through a spacer having planar dimensions lower than planar dimensions of a base of said microcomponent for providing access to said contacts for connecting said sections thereto. An intermediate product includes the chip carrier and a grid conencted to the lower face thereof, including connecting sections and an edge strip connecting the external ends of all sections.

8 Claims, 4 Drawing Sheets

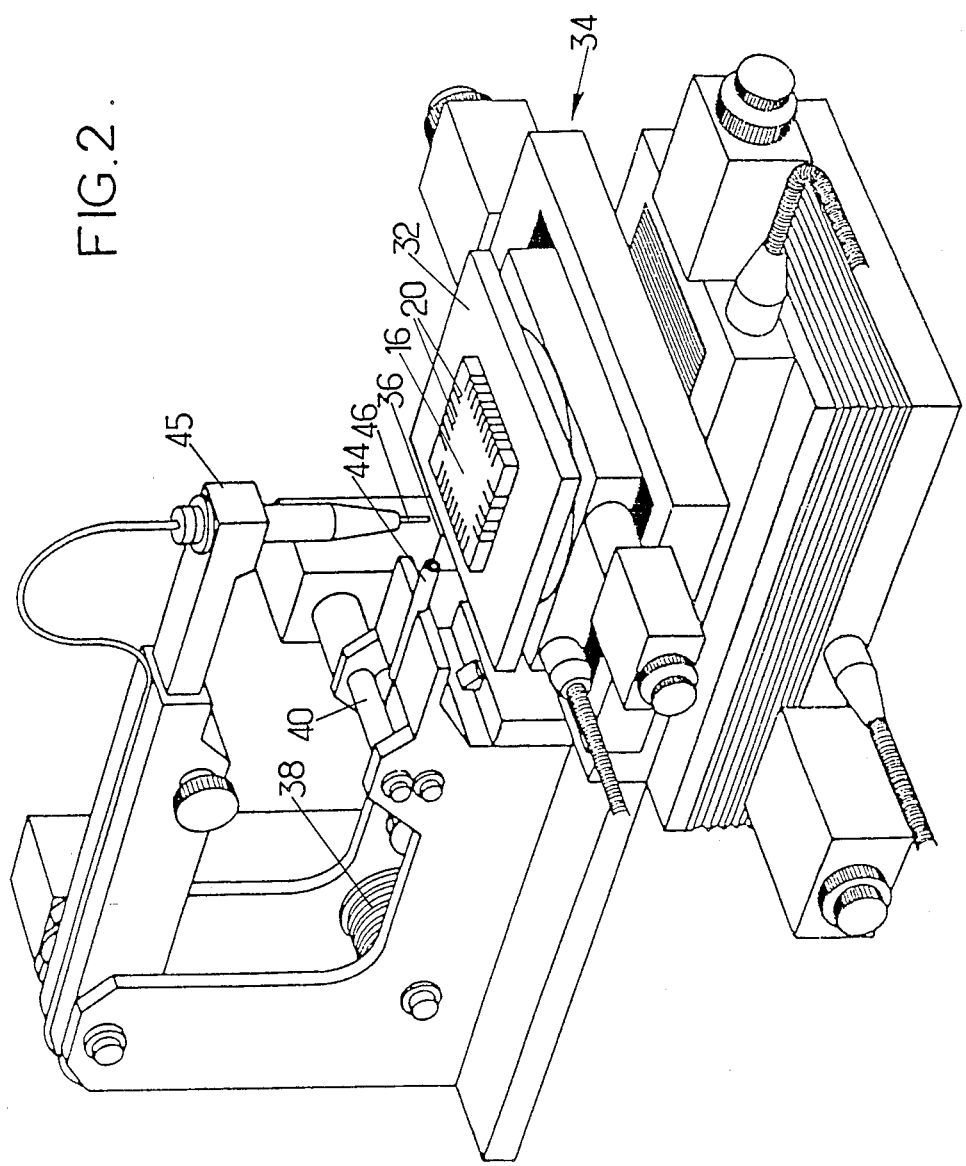

MOUNTING OF ELECTRONIC MICROCOMPONENTS ON A SUPPORT

BACKGROUND OF THE INVENTION

1. Technical field

The present invention relates to a method for mounting, on a printed circuit support, electronic microcomponents to be fixed flat and having, on their lower face, contacts which can be soldered for connecting them to the printed circuit. It also relates to a circuit obtainable using this method. It is intended to make it possible to connect a microcomponent having a heat expansion coefficient appreciably different from that of the support, even if it has large dimensions.

A particularly important, although not exclusive, application of the method consists of mounting "chip-carriers" devoid of connection lugs and whose size is very much less than that of the conventional integrated circuit chips. It is however applicable to other microcomponents whose material is poorly adapted, from the thermal expansion point of view, to the support receiving them. This is the case for example for a variety of passive circuits (resistance networks in particular) to be fixed on a ceramic substrate or on a printed circuit, having metal-coated connecting notches at the periphery thereof.

The chip carriers have a ceramic base with, on its lower face, contacts for fixing it flat on a support. The difference between the expansion coefficients of the ceramic and of the glass-epoxy or glass-polyimide laminate which forms most of the usual printed circuit supports leads to assemblies which cannot stand thermal cycles. In particular, the stresses due to the differential expansion risk destroying the contacts.

2. Prior Art

Different remedies have been proposed for overcoming the above-mentioned problem. Carriers have in particular been formed whose connecting lugs have a so-called "gull wing shape" so that they can tolerate an expansion differential between the base and support. The flexibility of these lugs is limited and there only exist some sizes of chip carriers having such lugs. Another solution for overcoming the stress phenomena of thermal origin is using a support made of a material having a heat expansion coefficient comparable to that of ceramic. In particular, supports have been used formed from quartz, co-laminate products, synthetic materials such as "kevlar". These supports are expensive and difficult to obtain in large sizes.

French Application No. FR-A-2 523 397 describes a method for solving the problem of differential heat expansion in cases where the support has soldering tabs between which the equipotential connections are formed as insulated flexible wire sections rather than as printed tracks. In this method, the component is fixed flat on the support by mechanical connecting means capable of tolerating differential expansions, formed by an intermediate element made of a material thermally compatible with the microcomponent and electric connections are formed by soldering the contacts of the microcomponent on a conducting network formed on the element and extending beyond the component. This method is of particular interest for circuits to be manufactured in small numbers, due to the number of connections to be made manually.

SUMMARY OF THE INVENTION

It is an object of the invention to make it possible to mount microcomponents flat on any type of support, such as a conventional printed circuit board (possibly of a multi-layer type) or a thick layer or thin layer circuit board. It also has as an object a method which is not only applicable to conventional chip carriers having up to 84 outputs spaced up at a spacing of 1.27 mm, but which can also be extrapolated to chip carriers having up to 228 output contacts and to the chip carriers whose output contacts are distributed at a spacing of 0.635 mm, not yet widely used.

For that purpose, there is provided a method for mounting, on a support carrying a printed circuit, electronic microcomponents to be fixed flat and having on their lower face, contacts which can be soldered and for connecting these microcomponents to the circuit; the microcomponent is fixed flat on the support by mechanical connection means capable of tolerating differential expansions. The contacts of microcomponents are connected to the printed circuit by flexible wire sections having a sufficient curvature to provide mechanical decoupling.

The mechanical connection means comprise a spacer having planar sizes smaller than those of a base of the component for access to be possible to the contacts. The spacer is made of a material having an expansion coefficient comparable to that of the microcomponent. This material, placed in line with a cavity in the chip carrier which receives the active microcomponent, must have an interface with the chip carrier and with the support which is as good a heat conductor as possible and it makes it possible to remove the heat released by the active component. The spacer has a sufficient height so that the flexible wire sections have a degree of curvature sufficiently high for the differential expansion of the support and of the component simply to modify the curvature without subjecting the wire sections to tensile stresses : a spacer thickness between 0.3 and 0.5 mm generally gives satisfactory results.

In a first embodiment of the invention, which lends itself particularly to the construction of prototypes, flexible wire sections are made individually from tinned copper wire, or from enameled wire when wire sections must cross each other. The sections are first of all fixed to the chip carrier. The spacer is bonded to the chip carrier. Finally, the wire sections are brazed on the support automatically or manually. This operation may in particular be carried out by using the means described in French patents 2 191 399, 2 327 019 and 2 327 025 to which reference may be had.

In another embodiment of the invention, all connecting wire sections to be fixed on a same microcomponent are fast with an edge strip and with a central zone so as to form a grid and are fixed in a single operation on all contacts of the microcomponent. The edge band and the central zone are then cut out and removed when they are no longer necessary.

The invention also provides a product comprising an electronic microcomponent fixed flat and having contacts on its lower face, a grid with an edge band connecting the external ends of connecting sections soldered to the contacts and a spacer made from a material having an expansion coefficient compatible with that of the microcomponent, whose planar dimensions are less than those of the microcomponent and which is bonded to the underface of the microcomponent.

The invention will be better understood from the following description of different embodiments, given by way of non limiting examples. The description refers to the accompanying drawings:

BRIEF DESCRIPTION OF THE DRAWINGS

FIG. 2 is a perspective view of an apparatus for automatically soldering wire sections on a microcomponent before transferring it to the support;

FIG. 3 is a perspective diagram, in partial cross-section, showing a fragment of an intermediate product obtained by using a modified method;

FIG. 4 shows a fragment of a grid which can be used for implementing the modification;

FIG. 5, similar to FIG. 3, shows the connecting wire sections after soldering the microcomponent and cutting out the internal zone;

FIG. 6 is a detailed view, in which the scale has not been respected, showing a narrowed zone of the connecting wire sections which belong to the grid of FIG. 4;

FIG. 7 is a perspective diagram showing a method for collective soldering of the contact wire sections of the grid of FIG. 4 on the microcomponent.

DETAILED DESCRIPTION OF PREFERRED EMBODIMENTS

Figure 1:
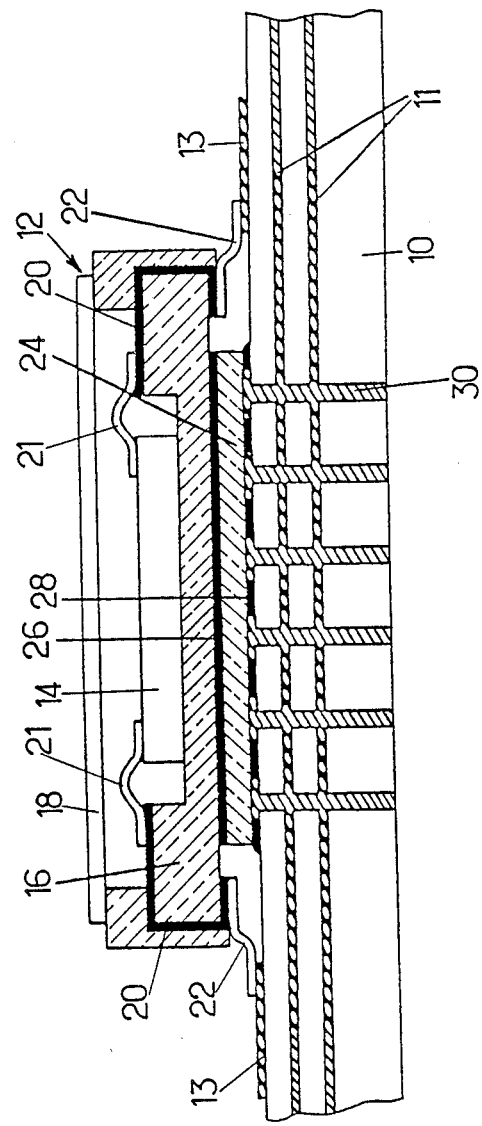
FIG. 1 is a diagram, in cross-section along a plane perpendicular to the support, showing a product resulting from the use of the method, comprising a chip carrier on a printed circuit support.

The product shown schematically in FIG. 1 comprises a printed circuit support 10 which, as shown, has metal-coated intermediate ground and heat removal planes 11, for example made from copper. Although the invention makes it possible to use printed circuit supports conventionally formed of glass-epoxy composite, it will generally be advantageous, when it is desired to obtain high performance and high reliability circuits for space use, a support of quartz-polyimide or glass-polyimide laminate which is now currently available commercially and have constant characteristics The support carries conducting tracks ending with soldering tabs 13.

The support 10 carriers microcomponents which may be of different kinds. Only one chip carrier 12 is shown containing an intermediate circuit 14. The chip carrier is formed of a base 16 made from a ceramic material, closed by a cover 18.

The integrated circuit chip 14 is connected to the solderable contacts 20 of the chip carrier in any way, for example by connections 21 which are not concerned directly by the invention. But, in accordance with an aspect of the invention, the chip carrier is equipped with sections 22 of flexible connecting wire which will generally be tinned copper wire of small diameter (0.14 mm for example). Each of the wire sections 22 connects one of the contacts 20 of the chip carrier to a tab 13 of the printed circuit support.

In order to retain the chip carrier 12 above support 10 and to force the wire section 22 to assume a curvature which protects them subsequently from mechanical stresses, the chip carrier 12 is not fixed directly to the support 10 A spacer 24 made from a material having a heat expansion coefficient comparable to that of base 16 is located between the support and the base. The spacer may in particular be of alumina or beryllium oxide. The thickness of the spacer will generally be between 0.3 and 0.5 mm.

The planar dimensions of the spacer 24 are less than those of the base, so the spacer is away from the solderable contacts 20. It is consequently possible to form it from a product which is electrically conducting to the extent that the support has no metal track underneath. The spacer 24 is fixed to the base by bonding, for example using an adhesive film 26 of "Ablestick" trademark. Spacer 24 is bonded to support 10 with a varnish 28, generally a polyurethane varnish, deposited at least on the central portion of the spacer, i.e. where the thermal flux due to the heating of the chip will have to flow, and where the thermal impedance of the interface must be as low as possible.

As illustrated in FIG. 1, the heat is removed towards the ground planes 11 by the metal coating occupying the holes 30 formed through support 10 and in contact with the ground planes. Heat transfer thus occurs in good conditions, the bottom of the base being applied onto the spacer, itself in good heat contact with the metal coating of the plated through holes.

The method may include the following successive steps.

The base of the chip carrier 16 is first of all provided with tinned flexible wire sections 22. For that, an apparatus of the kind shown in FIG. 2 may be used. Base 16 is applied, for example by suction, on a rotating plate 32 carried by a table 34 having crossed movements and with step by step advance. The means for connecting the plate 32 to table 34 are provided so that the plate can be given angular positions at 90° from each other. The apparatus also comprises means for feeding the required enamelled wire 36. The means may in particular comprises a wire reel 38, rollers 40 having a motor for feeding the wire, each time by a predetermined length, and a guide conduit 44. The apparatus further comprises a bracket 45 swinging in the vertical direction and equipped with an electric soldering torch 46. Once base 16 has been coated with tin and fixed to plate 32, table 34 is controlled so as to place the first contact 20 under the welding torch 46, then soldering may be carried out automatically. The base is then taken up by a suction nozzle, so as not to touch the wire sections.

The next step consists in providing base 16 with its spacer 24. For that, base 16 is laid on the spacer, having a adhesive film, in a heating press which starts polymerization of the adhesive film. A drop of varnish is deposited on the spacer, opposite to the adhesive film, and the assembly is positioned on the printed circuit support. The wire sections are aligned with the soldering tabs provided on the support and brazing is carried out individually with an apparatus which may be of one of the types described in the above mentioned French documents. Brazing on the support does not melt the soldered connections already made on the base.

Once all the microcomponents equipping the support have been placed in position the assembly is placed in an oven for full polymerization of the adhesive film and varnishes.

It is important to note that a defective microcomponent may be withdrawn; a wire section may be removed leaving a furrow in which another wire may subsequently be placed. Varnishes are known whose shearing resistance is sufficiently low for withdrawing the chip carrier by simply twisting it.

In the modification of the invention shown in FIG. 3, the connecting wire sections 22 to be fixed on the same microcomponent are initially integral with an edge strip 48 and a central zone 50 (FIG. 4), so that the assembly forms a grid cut out from a thin sheet (100 μm for example). An opening is formed in the central zone 50 so that the microcomponent can be directly seized using a suction nozzle and the microcomponent can possibly be re-loaded with solder which is then distributed by centrifugation. The sections have a main portion 22a having the desired width for forming the connecting wire sections and a narrowed portion 22b which is intended to be cut after soldering of sections 22 on contacts 20. Portions 22a and 22b may for instance be respectively 200 μ and 100 μ wide.

The method of the invention is then carried out as follows.

The grid is laid on the base 16 whose contacts 20 have been pretinned, for example by depositing molten tin, then by centrifugation. After checking that the grid is accurately positioned, the sections 22 are soldered simultaneously using a heating electrode 52 of appropriate shape (FIG. 7). The central zone 50 is separated, for example, by cutting using a knife acting on the narrow portions 22b, along line 54 of FIG. 6. A slight pressure of the knife is sufficient, due to the small thickness of sections 22 and the small width of portion 22b. Once the central zone has been removed, the base assembly has the aspect shown in FIG. 5. It forms an intermediate product which may be commercialized and kept in that condition until it is finally mounted. The edge strip 48 forms a frame which holds all the contacts at the same potential and avoids the risk of a high differential voltage appearing which could damage the chip carried by the chip carrier. In addition, the edge strip 48 holds all the sections 22 in position with correct spacing, particularly during handling and during bonding of spacer 24.

Just before fitting and brazing of the product on the support, the edge strip 48 is removed by cutting with a knife, for example along line 56 (FIG. 6). All contacts may be again brazed at the same time using an electrode of the same kind as that of FIG. 7. Due to the presence of spacer 24, the bearing force of the heating electrode automatically gives the sections 22 the required curvature for them to be able to subsequently withstand the differential expansions without being under tension.

A microcomponent fixed and connected using the embodiment shown in FIG. 3 to 7 may be removed and replaced. For that, the sections 22 are unsoldered from support 10, for example using a jet of hot gas, the microcomponent may then be removed by breaking the varnish by twisting, to the extent that a varnish has been used which has a low shearing strength, such as "solithane". The remaining solder may be removed by heating and centrifugation before re-loading.

It can be seen that the method of invention makes it possible to fix microcomponents flat on support which also receive microcomponents with through pads. The support need not be made from a material with an expansion coefficient comparable to that of the ceramic forming for example the chip carriers. This support may in particular be a printed circuit board made from a glass-epoxy composite or, especially when the final circuit is intended to be used in the outer space, a glass-polyimide composite. The connections formed are v short, which is a favorable element for ultra-high frequency use. The supports used may of a type allowing tracks to be formed by photolithography, which makes it possible to have smaller thicknesses than silk screen printing, the only method which can be used at the present time on ceramics.

The invention is not limited to the particular embodiment which have been shown and described by way of examples. Numerous modifications are possible. In particular, the microcomponent with its spacer and connecting wire sections may be fixed to the support by methods other than brazing, particularly by refusion soldering in a gaseous phase.

We claim:

1. A method of flat mounting an electronic microcomponent on a printed circuit support, said microcomponent having solderable contacts on a lower face thereof, comprising: electrically connecting said solderable contacts of the microcomponent to respective pads on the printed circuit support through respective individual sections of flexible wires having a sufficient degree of curvature for avoiding transfer of mechanical stresses between said microcomponent and said printed circuit support and mechanically connecting the microcomponent to the support through a spacer having planar dimensions lesser than planar dimensions of the lower face of said microcomponent for providing access to said solderable contacts for connecting said sections thereto.

2. Method according to claim 1, wherein said individual sections of flexible wire consists of individual sections of tin coated copper wire.

3. Method for mounting an electronic microcomponent having solderable contacts on a lower surface thereof flat on a printed circuit support, comprising: mechanically connecting the microcomponent to the support through mechanical connection means constructed and arranged for absorbing stresses due to differential expansion of said support and microcomponent; and electrically connecting the solderable contacts of the microcomponent to the respective pads on the printed circuit through sections of flexible wire having a sufficient degree of curvature for avoiding transfer of mechanical stresses between said microcomponent and circuit, by forming a grid including said sections, an outer edge strip and a central zone integral with said sections, connecting all sections at the same time on said contacts on the microcomponents, and cutting off said outer strip and said central zone.

4. Method according to claim 3, wherein said grid has a thickness of about 100μ.

5. Method according to claim 3, wherein said mechanical connection means include a flat spacer having planar dimensions lesser than those of said lower surface of the microcomponent for providing access to the contacts.

6. Method according to claim 5, wherein said spacer has a thickness of from 0.3 to 0.5 mm.

7. Method according to claim 3, wherein said sections of said grid are formed with narrow portions close to said central zone.

8. Method according to claim 7, wherein the step of cutting off said outer edge strip and said central zone includes:
  simultaneously cutting all said narrow portions with a knife, and
  simultaneously cutting off all said contacts close to said outer edge strip, immediately prior to fitting the product on the printed circuit support.

* * * * *